United States Patent
Kobayashi

(10) Patent No.: US 6,193,863 B1
(45) Date of Patent: Feb. 27, 2001

(54) PRODUCT CONVEYANCE MECHANISM FOR ELECTROPLATING APPARATUS

(76) Inventor: Hideyuki Kobayashi, 1-11-11, Omiya-cho, Mishima-shi, Shizouka-ken (JP)

(*) Notice: Subject to any disclaimer, the term of this patent is extended or adjusted under 35 U.S.C. 154(b) by 0 days.

(21) Appl. No.: 09/341,865
(22) PCT Filed: Jan. 19, 1998
(86) PCT No.: PCT/JP98/00177
§ 371 Date: Jul. 20, 1999
§ 102(e) Date: Jul. 20, 1999
(87) PCT Pub. No.: WO98/32901
PCT Pub. Date: Jul. 30, 1998

(30) Foreign Application Priority Data

Jan. 22, 1997 (JP) .................................................. 9-021918

(51) Int. Cl.⁷ ...................................................... C25B 11/00
(52) U.S. Cl. ................. 204/288.3; 204/279; 204/286.1; 204/297.09; 204/297.1; 204/297.14
(58) Field of Search ............................. 204/279, 297.09, 204/297.1, 297.14, 286.1, 288.3

(56) References Cited

U.S. PATENT DOCUMENTS

| | | | |
|---|---|---|---|
| 4,005,000 | * 1/1977 | Kraska | 204/297.09 |
| 4,752,371 | * 6/1988 | Kreisel et al. | 204/297.09 |
| 5,901,997 | * 5/1999 | Bayer | 204/297.09 |
| 5,904,820 | * 5/1999 | Brown et al. | 204/279 |

* cited by examiner

Primary Examiner—Bruce F. Bell
(74) Attorney, Agent, or Firm—Wenderoth, Lind & Ponack, L.L.P.

(57) ABSTRACT

A product conveying mechanism is provided for an electroplating device which electroplates a thin-wall ribbonlike product such as a printed wiring board given to be plated. It suspends the product from the upper part thereof nipped with a jig supported laterally movably by a cathode bar and conveys the product laterally in an electrolyte solution held in a tank meanwhile feeding an electric current from the cathode bar via the jig to the product through the upper part thereof. The product conveying mechanism is particularly furnished with a jig of striking originality combining the function of nipping a product and the function of feeding an electric current to the product. The jig (2) supported laterally movably by a cathode bar (1) is so constructed as to electroplate a thin-wall ribbonlike product such as a printed wiring board given to be plated by nipping the product in the upper part and suspending the produce from the nipped upper part and laterally conveying the product in an electrolyte solution (B) held in a tank (3) while feeding an electric current from the cathode bar to the upper part of the product through the jig. Thus, the jig (2) combines the function of nipping the product and the function of feeding an electric current to the product.

4 Claims, 5 Drawing Sheets

PRODUCT CONVEYANCE MECHANISM FOR ELECTROPLATING APPARATUS

TECHNICAL FIELD

This invention relates to a product conveying mechanism for an electroplating device adapted to electroplate a thin-wall ribbonlike product such as a printed wiring board or a lead frame, which mechanism nips the product in the upper part thereof, suspends it from the nipped part, and conveys the product laterally through an electrolyte solution held in a tank meanwhile feeding an electric current to the product via the upper part thereof.

BACKGROUND ART

The jig which is generally used for fixing in position a thin-wall ribbonlike product such as a printed wiring board or a lead frame has a construction which is composed of a hanger comprising a polar bar connecting part suspended from a cathode bar and possessed of a cross section of the approximate shape of three sides of a square and a main skeletal part, and a rack serving to mount thereon the product suspended from the main skeletal part of the hanger and is adapted to fix the rack to a frame of a rectangular shape and meanwhile keep the boundaries of thin-wall ribbonlike products nipped with a plurality of spring clips attached to the frame. These products are generally electroplated by being placed wholly together with the rack in an electrolyte solution.

This invention has for an object thereof the provision of a product conveying mechanism for an electroplating device which electroplates a thin-wall ribbonlike product such as a printed wiring board given to be plated, which mechanism suspends the product from the upper part thereof nipped with a jig supported laterally movably by a cathode bar and conveys the product laterally in an electrolyte solution held in a tank meanwhile feeding an electric current from the cathode bar via the jig to the product through the upper part thereof.

The invention is particularly directed at providing a product conveying mechanism which is furnished with a jig of striking originality combining the function of nipping a product and the function of feeding an electric current to the product. The jig provided by this invention is intended to allow the attachment and detachment of the thin-wall ribbonlike product to be infallibly attained with ease and ensure infallible supply of an electric current from a cathode bar to the product through the jig serving to nip the product in the upper part thereof.

Another object of this invention is to provide a product conveying mechanism which is furnished with a product sway preventing means adapted to prevent the thin-wall ribbonlike product from swaying while the product nipped in the upper part thereof with the jig is electroplated as laterally conveyed in the electrolyte solution held in a tank.

DISCLOSURE OF THE INVENTION

This invention consists in providing a product conveying mechanism for an electroplating device which electroplates a thin-wall ribbonlike product such as a printed wiring board given to be plated, which mechanism suspends the product from the upper part thereof nipped with a jig supported laterally movably by a cathode bar and conveys the product laterally in an electrolyte solution held in a tank meanwhile feeding an electric current from the cathode bar via the jig to the product through the upper part thereof, the product conveying mechanism being composed of the cathode bar having a rectangular cross section and having a difference in the lateral width of the rectangular cross section between the width during the step of releasing the thin-wall ribbonlike product from the nip and the width during the step of nipping the ribbonlike product; a jig supported laterally movably by the cathode bar and adapted to nip the thin-wall ribbonlike product in the upper part thereof, suspend the product from the upper part thereof and feed an electric current to the thin-wall ribbonlike product through the nipped part thereof; and a conveying means furnished with an engaging claw to be meshed with an engaging projection formed on the jig and adapted to move laterally the jig along the cathode bar in consequence of the lateral transfer of the engaging claw, and the jig, particularly for the purpose of acquiring an ability to combine a function of nipping a product and a function of feeding an electric current to the product, allowing the attachment and detachment of a thin-wall ribbonlike product to be effected infallibly and easily, and ensuring infallible supply of an electric current from the cathode bar via the jig to the product through the nipped upper part of the product, being composed of a supporting member made of a synthetic resin and inserted around the cathode bar laterally movably along the cathode bar, a first planar contact plate made of a conductive metal material such as stainless steel and adapted to utilize the upper part side thereof as a contact leaf part allowed to establish face contact with one lateral face side of the cathode bar and urged with the spring pressure exerted by a spring member on the one lateral face side of the cathode bar and utilize the lower part side thereof as a nipping leaf part adapted to nip the thin-wall ribbonlike product in the upper part, a second contact plate made of a conductive metal material such as stainless steel and having integrally formed in the shape of the letter L a contact leaf part allowed to establish face contact with the bottom face side of the cathode bar and urged with the spring pressure exerted by a spring member on the bottom face side of the cathode bar and a nipping leaf part opposed to the nipping leaf part of the first contact plate, product nipping spring members adapted to establish close mutual contact between the nipping leaf parts of the first contact plate and the second contact plate and exert the spring pressure on the nipping leaf parts from outside so as to allow the closely contacting nipping leaf parts to nip therebetween the thin-wall ribbonlike product in the upper part thereof, a moving vacant part formed in the supporting member for allowing the lower part of the first contact plate to be moved away from the product nipping position toward the outside, and a pressure imparting means for pressing the cathode bar lateral face contact leaf part of the first contact plate against the one lateral face side of the cathode bar in opposition to the spring pressure of the product nipping spring member urged on the nipping leaf part of the first contact plate, and being so constructed as to effect mutual separation of the nipping leaf parts and consequent release of the thin-wall ribbon product from the nipping leaf parts by pressing the cathode bar lateral face contact leaf part against a gap formed on the one lateral face side of the cathode bar by virtue of the pressure imparting means at the position at which the cathode bar forms a narrowed part of the lateral width and pressing the L-shaped corner part of the second contact plate backward and meanwhile moving the lower part of the first contact plate backward into the vacant place with a stepped part formed at the upper end of the vacant place as a fulcrum.

The pressure imparting means mentioned above constitutes the spring pressure for the cathode bar lateral face pressing spring member serving to exert constantly the spring pressure on the upper part of the first contact plate so as to press the cathode bar lateral face contact leaf part of the first contact plate against the one lateral face side of the cathode bar. Further, the pressure imparting means mentioned above can constitute the operating force for an operating pin moved forward and backward via a through hole formed in the supporting member to reach the cathode bar lateral face contact leaf part and consequently allow the cathode bar lateral face contact leaf part of the first contact plate to be pressed against the one lateral face side of the cathode bar.

Since the cathode bar lateral face contact leaf part of the first contact plate is enabled to establish strong face contact with the one lateral face side of the cathode bar owing to the provision of the spring member for pressing one lateral face of the cathode bar and further since the cathode bar bottom face contact leaf part of the second contact plate is enabled to establish strong face contact with the bottom face side of the cathode bar owing to the provision of the spring member for pressing the bottom face of the cathode bar, supply of electric current from the cathode bar to the nipping leaf parts of the first contact plate and the second contact plate is infallibly attained through the face contact parts mentioned above.

Further, this invention, for the purpose of preventing the thin-wall ribbonlike product from sway while the product nipped in the upper part thereof with the jig is electroplated as conveyed laterally in an electrolyte solution held in a tank, is directed at providing a product conveying mechanism furnished with a product sway preventing means constructed by forming a depressed guide groove on the bottom part side of the tank interior so as to admit the lower parts of the laterally conveyed ribbonlike products as spaced along the path of conveyance of the ribbonlike products, forming a rectifying box on the bottom part of the tank interior so as to be overlaid by the depressed guide groove, forming in the depressed guide groove along the central track on the depressed bottom wall of the depressed guide groove a draining conduit for allowing the electrolyte solution in the tank to flow into the rectifying box, forming in the rectifying box a baffle plate having a plurality of holes opened therein for uniformizing the pressure distribution in the electrolyte solution flowing in through the draining conduit, and forming a draining mouth for discharging out of the tank the electrolyte solution which has passed through the interior of the rectifying box, thereby guiding the lower parts of the ribbonlike products admitted into the depressed guide groove by dint of the rectifying action of the electrolyte solution discharged uniformly into the rectifying box through the draining conduit formed in the depressed guide groove along the central track on the depressed bottom wall toward the position of the central track on the depressed bottom wall in the depressed guide groove having the draining conduit formed therein.

BEST MODE OF EMBODYING THE INVENTION

The embodiment of the present invention will be described below with reference to the accompanying drawings.

Figure 1:
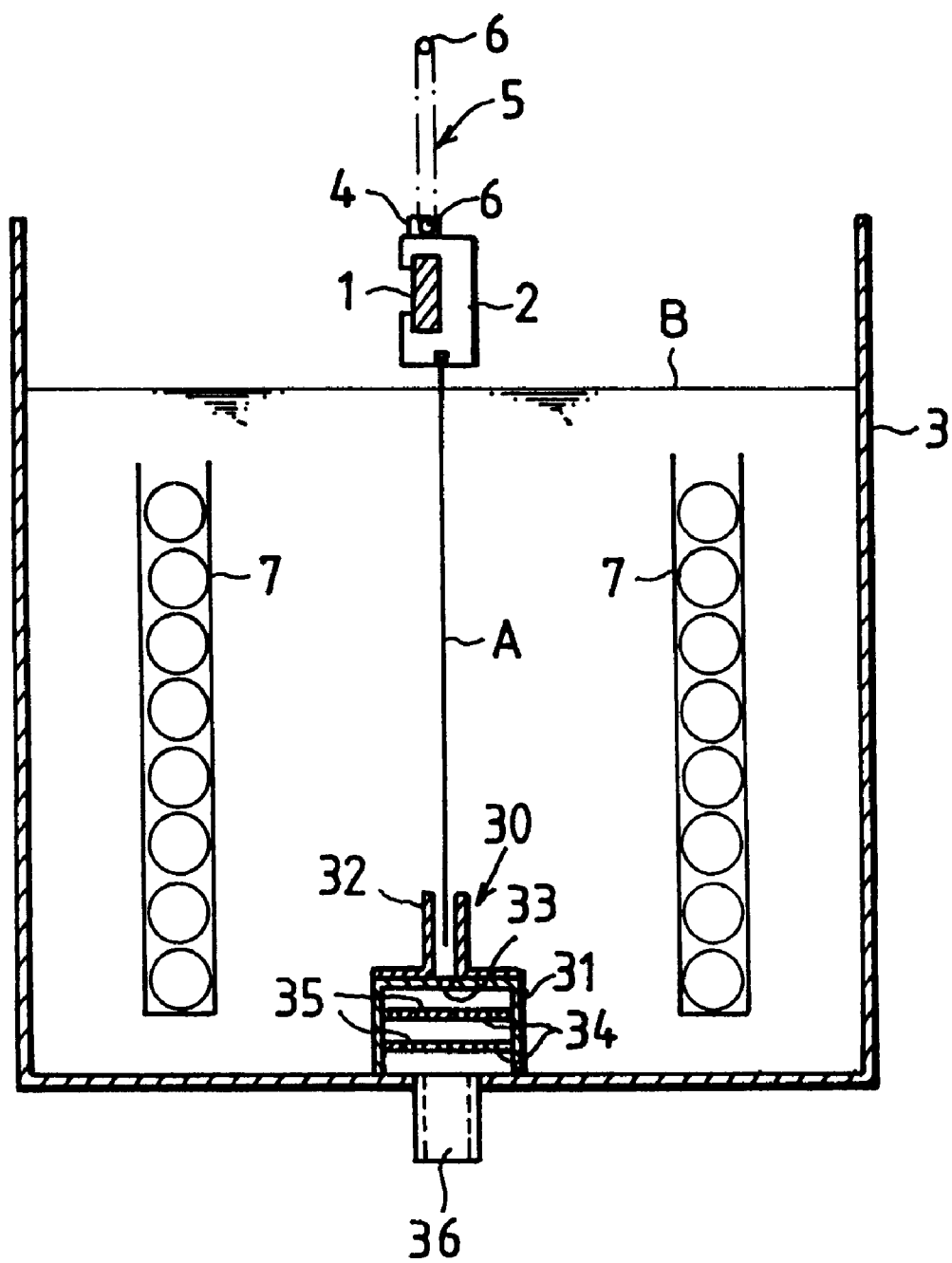
FIG. 1 is a longitudinal cross-sectional side view illustrating a product conveying mechanism for an electroplating device according to this invention.
Figure 2:
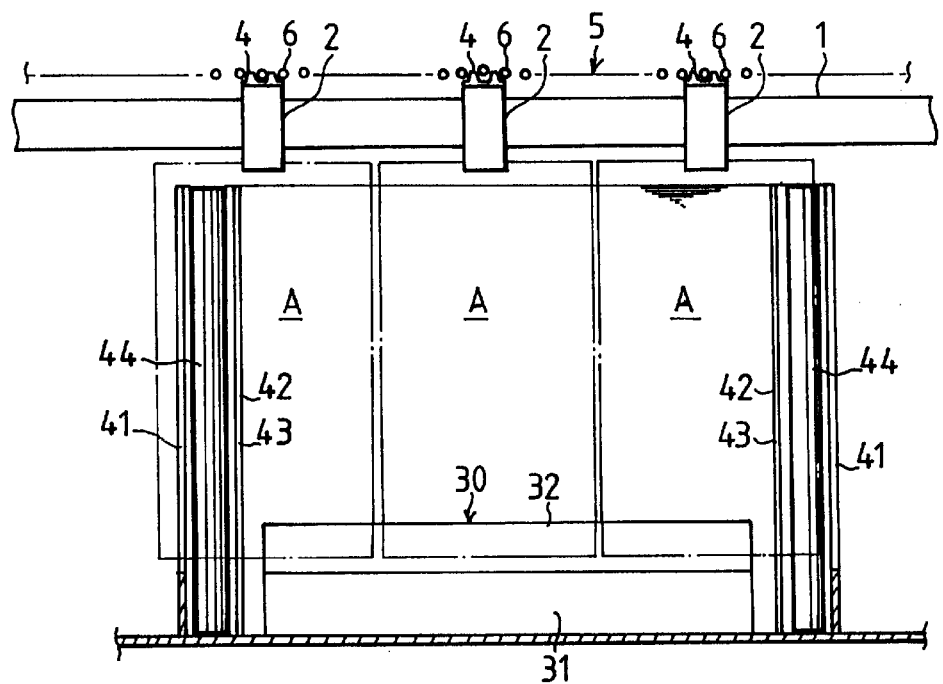
FIG. 2 is a front view illustrating the product conveying mechanism for the electroplating device according to this invention.
Figure 3:
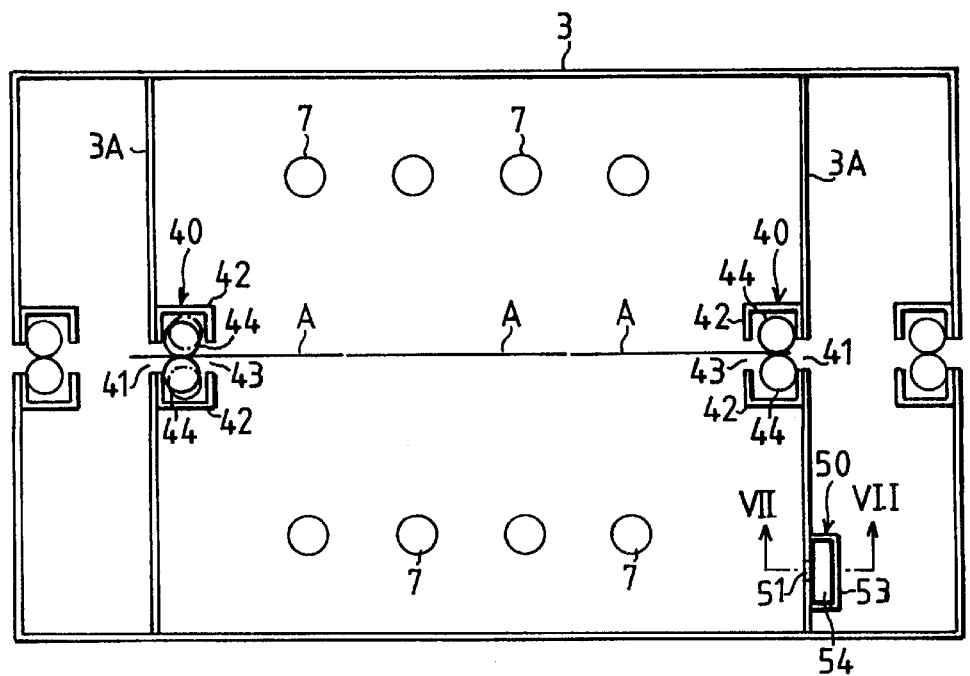
FIG. 3 is a plan view illustrating the product conveying mechanism for the electroplating device according to this invention.
Figure 4:
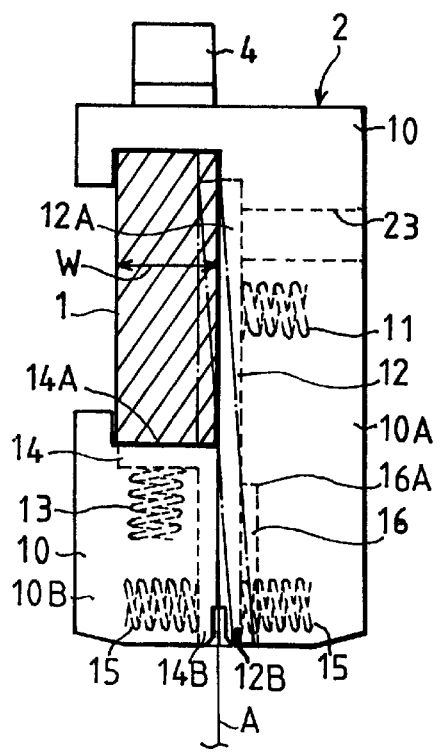
FIG. 4 is a side view of a jig to be used in the product conveying mechanism for the electroplating device according to this invention.
Figure 5:
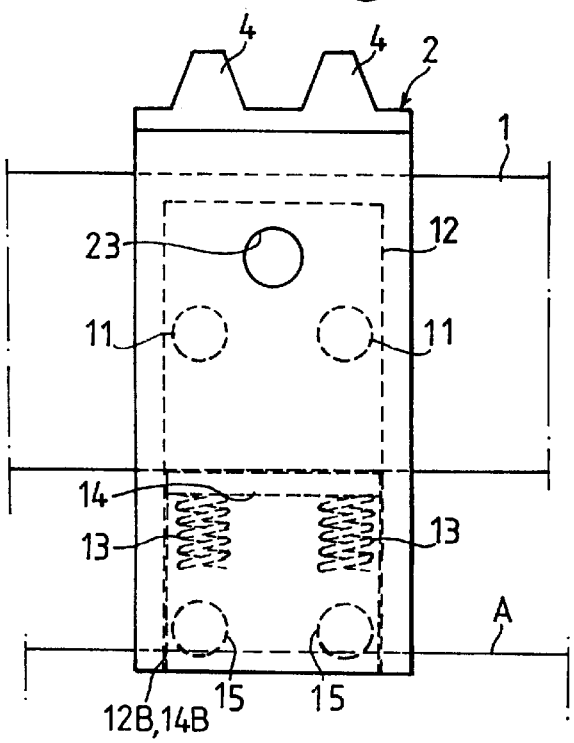
FIG. 5 is a front view of the jig to be used in the product conveying mechanism for the electroplating device according to this invention.
Figure 6:
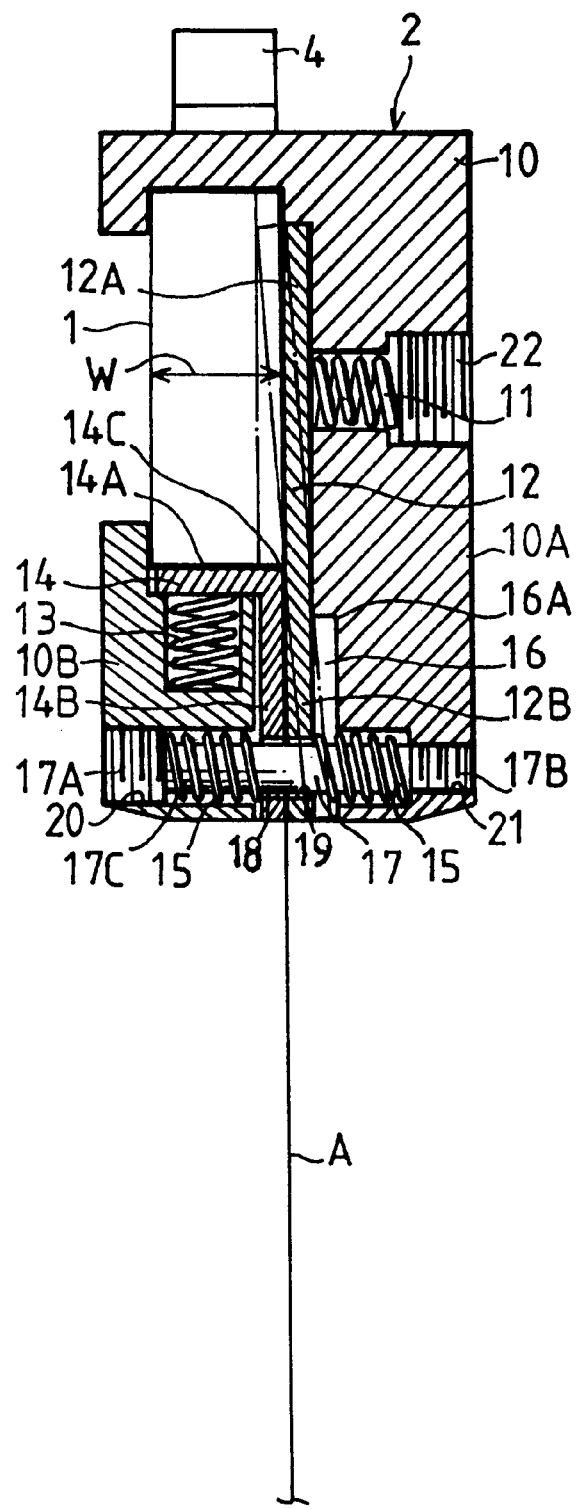
FIG. 6 is a longitudinal cross-sectional side view of the jig to be used in the product conveying mechanism for the electroplating device according to this invention.

FIG. 1 through FIG. 3 illustrate wholly the product conveying mechanism for the electroplating device according to this invention and FIG. 4 through FIG. 6 illustrate the jig to be used in the product conveying mechanism.

The electroplating device of this invention electroplates a thin-wall ribbonlike product A such as a printed wiring board by suspending the product from the upper part thereof nipped with a jig 2 supported laterally movably by a cathode bar 1 and laterally conveying the product A in an electrolyte solution B held in a tank 3 meanwhile feeding an electric current from the cathode bar 1 to the upper part of the product through the jig 2.

The product conveying mechanism for this electroplating device is composed of the cathode bar 1 having a rectangular cross section and having a difference in the lateral width (W) of the rectangular cross section between the width during the step of releasing the thin-wall ribbonlike product A from the nip and the width during the step of nipping the thin-wall ribbonlike product A, the jig 2 supported laterally movably by the cathode bar 1 and adapted to nip the thin-wall ribbonlike product A in the upper part thereof, suspend the product from the upper part thereof, and feed an electric current to the thin-wall ribbonlike product A through the nipped part thereof, and a conveying means 5 formed of an endless chain furnished with an engaging claw 6 to be meshed with an engaging projection 4 formed on the jig 2 and adapted to move laterally the jig 2 along the cathode bar 1 in consequence of the lateral transfer of the engaging claw 6. In FIG. 1 and FIG. 3, reference numeral 7 denotes an anode (ball anodes contained in an anode case).

The jig 2 mentioned above, as illustrated in FIG. 4 through FIG. 6, is composed of a supporting member 10 made of a synthetic resin and inserted around the cathode bar 1 laterally movably along the cathode bar, a first planar contact plate 12 made of a conductive metal material such as stainless steel and adapted to utilize the upper part side thereof as a contact leaf part 12A allowed to establish face contact with one lateral face side of the cathode bar 1 and urged with the spring pressure exerted by a spring member 11 made of a coil spring on the one lateral face side of the cathode bar and utilize the lower part side thereof as a nipping leaf part 12B adapted to nip the thin-wall ribbonlike product A in the upper part, a second contact plate 14 made of a conductive metal material such as stainless steel and having integrally formed in the shape of the letter L a contact leaf part 14A allowed to establish face contact with the bottom face side of the cathode bar 1 and urged with the spring pressure exerted by a spring member 13 on the bottom face side of the cathode bar 1 and a nipping leaf part 14B opposed to the nipping leaf part 12B of the first contact plate 12, product nipping spring members 15, 15 each made of a coil spring and adapted to establish close mutual contact between the nipping leaf parts 12B and 14B of the first contact plate 12 and the second contact plate 14 and exert the spring pressure on the nipping leaf parts 12B and 14B from outside so as to allow the closely contacting nipping leaf parts 12B and 14B to nip therebetween the thin-wall ribbonlike product A in the upper part thereof, a moving vacant part 16 formed in the supporting member 10 for allowing the lower part of the first contact plate 12 to be moved away from the product nipping position toward the outside, and a pressure imparting means for pressing the cathode bar lateral face contact leaf part 12A of the first contact plate 12 against the one lateral face side of the cathode bar 1 in opposition to the spring pressure of the product nipping spring member 15 urged on the nipping leaf part 12B of the first contact plate 12. This pressure imparting means constitutes the spring pressure for the cathode bar lateral face pressing spring member 11 serving to exert constantly the spring pressure on the upper part of the first contact plate 12 so as to press the cathode bar lateral face contact leaf part 12A of the first contact plate 12 against the one lateral face side of the cathode bar 1. The jig 2 is so constructed as to effect mutual separation of the nipping leaf parts 12B and 14B and consequent release of the thin-wall ribbon product A from the nipping leaf parts 12B and 14B by pressing the cathode bar lateral face contact leaf part 12A of the first contact plate 12 against a gap formed on the one lateral face side of the cathode bar 1 by virtue of the pressure imparting means (the spring pressure of the cathode bar lateral face pressing spring member 11) at the position at which the cathode bar forms a narrowed part of the lateral width (W) and pressing the L-shaped corner part 14C of the second contact plate 14 backward and meanwhile moving the lower part of the first contact plate 12 backward into the vacant place 16 with a stepped part 16A formed at the upper end of the vacant place 16 as a fulcrum.

The aforementioned supporting member 10 made of synthetic resin is composed of a first supporting member 10A for supporting the one lateral face side, the flat face side, and the other upper lateral face side of the cathode bar 1 and a second supporting member 10B supporting the bottom face side and the other lower lateral face side of the cathode bar 1. The first supporting member 10A and the second supporting member 10B are fixed by transfixing a clamping bolt 17 having screwed parts 17A and 17B formed in the opposite terminal parts thereof and a shank 17C formed in the middle part thereof across through holes 18 and 19 formed in the nipping leaf parts 12B and 14B of the first contact plate 12 and the second contact plate 14 and causing the screwed parts 17A and 17B to be meshed with screw holes 20 and 21 formed in the first supporting member 10A and the second supporting member 10B. To the shank 17C of the clamping bolt 17, the product nipping spring members 15, 15 each made of a coil spring are fitted in a compressed state. Reference numeral 22 denotes a blind screw for holding the cathode bar lateral face pressing spring member 11 formed of coil spring in a compressed state in a spring hole.

The pressure imparting means mentioned above can constitute the operating force for an operating pin (not shown) moved forward and backward via a through hole 23 formed in the supporting member 10 to reach the cathode bar lateral face contacting leaf part 12A and consequently allow the cathode bar lateral face contacting leaf part 12A of the first contact plate 12 to be pressed against the one lateral face side of the cathode bar 1.

The product sway preventing means denoted by reference numeral 30 in FIG. 1 and FIG. 2 is provided for the purpose of preventing the thin-wall ribbonlike product A from swaying while the product nipped in the upper part thereof with the jig 2 is electroplated by being laterally conveyed in the electrolyte solution B held in the tank 3. This product sway preventing means 30 is constructed by forming a depressed guide groove 32 on a rectifying box 31 formed on the bottom part side of the interior of the tank 3 so as to admit the lower parts of the laterally conveyed ribbonlike products A as spaced along the path of conveyance of the ribbonlike products A, forming in the depressed guide groove 32 along the central track on the depressed bottom wall of the depressed guide groove 32 a draining conduit 33 for allowing the electrolyte solution in the tank to flow into the rectifying box 31, forming in the rectifying box mentioned above a baffle plate 34 containing therein a plurality of open holes 35 having a smaller total opening area than the total opening area of the draining conduit 33 so as to uniformize the pressure distribution in the electrolyte solution flowing in through the draining conduit 33, and forming a draining mouth 36 for discharging out of the tank the electrolyte solution which has passed through the baffle plate 34 in the interior of the rectifying box 31, thereby guiding the lower parts of the ribbonlike products A admitted as spaced with a given interval into the depressed guide groove 32 by dint of the rectifying action of the electrolyte solution discharged uniformly into the rectifying box 31 through the draining conduit 33 formed in the depressed guide groove along the central track on the depressed bottom wall toward the position of the central track on the depressed bottom wall in the depressed guide groove 32 having the draining conduit 33 formed therein. By disposing a plurality of baffle plates 34 in a cascade pattern in the rectifying box 31 and causing the total opening area of the holes 35 formed in the baffle plates 34 to decrease in the descending order of the baffle plates 34, it is made possible to disperse the pressure of inflow to a greater extent, allow the electrolyte solution to flow more uniformly into the depressed guide groove 32, and improve the effect of rectification further.

A product passing means in a tank partition wall denoted by reference numeral 40 in FIG. 3 and FIG. 2 is provided for the purpose of enabling the thin-wall ribbonlike product A conveyed as nipped in the upper part thereof with the jig 2 to acquire smooth passage through an oblong product passing groove 41 formed in a partition wall 3A of the tank 3 so as to pass the partition wall 3A of the tank 3 and, at the same time, preventing the electrolyte solution in the tank 3 from flowing out through the product passing groove 41. The product passing means 40 in the tank partition wall is so constructed as to block the product passing groove 41 by forming within the tank 3 a roll regulating frame 42 for enclosing the oblong product passing groove 41 formed in the partition wall 3A of the tank 3 so as to allow passage through the partition wall 3A of the tank 3 of the thin-wall ribbonlike product A conveyed as nipped in the upper part thereof with the jig 2, forming on the product conveying track of the roll regulating frame 42 an inflow groove 43 for allowing inflow of the electrolyte solution in the tank and passage of the product, holding movably inside the roll regulating frame 42 a pair of rolls 44, 44 adapted to sink in an upright state into the electrolyte solution, and utilizing the flowing action of the electrolyte solution in the tank to be discharged from the inflow groove 43 to the product passing groove 41 for moving the pair of rolls 44, 44 from the position indicated by an alternate long and short dash line in FIG. 3 to the position of close contact with the partition wall 3A blocking the product passing groove 41 indicated by a solid line in FIG. 3 and establishing close mutual contact between the pair of rolls 44, 44.

The pair of rolls 44, 44 are formed of a plastic material made of vinyl chloride in such a manner that the center of gravity may be caused to occur in the lower parts of the rolls by placing weights in the lower parts of the rolls having a cavity formed in the upper part of roll for the purpose of enabling the rolls to sink in an upright state in the electrolyte solution.

The size of the jig 2 (excluding the engaging projection 4 mentioned above) is 38 mm in lateral width and 74 mm in height in the bearings of FIG. 5.

Figure 7:
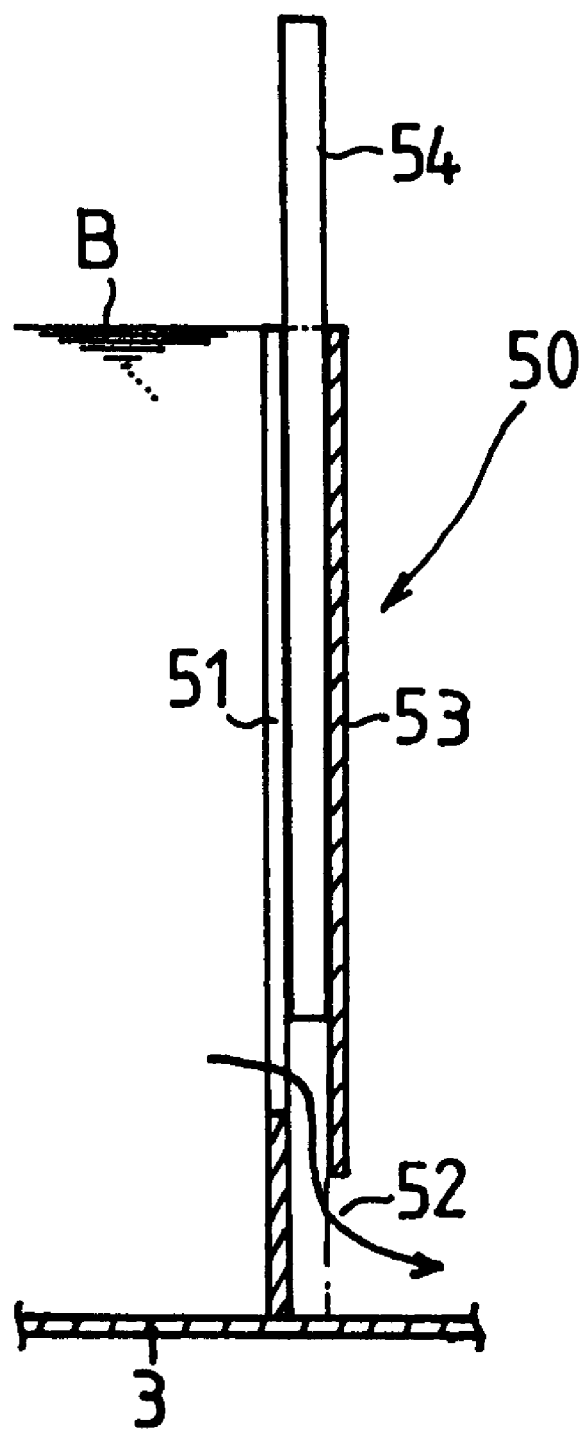
FIG. 7 is a longitudinal cross-sectional side view taken through FIG. 3 along line VII—VII.

In FIG. 3 and FIG. 7, reference numeral 50 denotes a draining device for adjusting the liquid level of the electrolyte solution B in the tank 3. This draining device 50 is constructed by enclosing oblong draining grooves 51 formed on the lateral wall and the partition wall of the tank 3 with a frame 53 having a draining mouth 52 opened in the lower part thereof and inserting a vertically movable adjusting plate 54 in the frame 53 so that the draining mouth 52 mentioned above may be opened and closed by the vertical motion of the adjusting plate 54. The vertical operation of this adjusting plate 54 is automatically controlled by a command issued from a liquid level sensor. Since this draining device 50 enables the electrolyte solution to flow out from the middle part of the tank 3, it can decrease the difference between the highest and lowest liquid levels as compared with the device which allows the electrolyte solution to flow out in an overflowing state. Since the difference between the highest and lowest liquid levels can be decreased as described above, the boundary of plating in the partially plated part of the product (the plating treatment performed excepting the upper part of the product) can be uniformized.

INDUSTRIAL APPLICABILITY

This invention provides a product conveying mechanism for an electroplating device which electroplates a thin-wall ribbonlike product such as a printed wiring board given to be plated by suspending the product from the upper part thereof nipped with a jig supported laterally movably by a cathode bar and conveying the product laterally in an electrolyte solution held in a tank meanwhile feeding an electric current from the cathode bar via the jig to the product through the upper part thereof. It particularly provides a product conveying mechanism which is furnished with a jig of striking originality combining the function of nipping a product and the function of feeding an electric current to the product. The jig provided by this invention allows the attachment and detachment of the thin-wall ribbonlike product to be infallibly attained with ease and ensures infallible supply of an electric current from a cathode bar to the product through the jig serving to nip the product in the upper part thereof.

Further, since the product conveying mechanism for the electroplating device according to this invention is furnished with a product sway preventing means, the thin-wall ribbonlike product can be prevented from swaying while the product nipped in the upper part thereof with the jig is electroplated as laterally conveyed in the electrolyte solution held in a tank.

What is claimed is:

1. A product conveying mechanism for an electroplating device serving to electroplate a thin-wall ribbonshaped product (A) including a printed wiring board given to be plated, which mechanism suspends said product from an upper part thereof nipped with a jig (2) supported laterally movably by a cathode bar (1) and laterally conveys said product (A) in an electrolyte solution (B) held in a tank (3) meanwhile feeding an electric current from said cathode bar (1) to the upper part of said product through said jig (2), said product conveying mechanism being composed of said cathode bar (1) having a rectangular cross section and having a difference in a lateral width (W) of said rectangular cross section between a width during the step of releasing said thin-wall ribbonshaped product (A) from the nip and a width during the step of nipping said thin-wall ribbonshaped product (A), said jig (2) supported laterally movably by said cathode bar (1) and adapted to nip said thin-wall ribbonshaped product (A) in the upper part thereof, suspend said product from the upper part thereof and feed an electric current to said thin-wall ribbonshaped product (A) through the nipped part thereof, and a conveying means (5) furnished with an engaging claw (6) to be meshed with an engaging projection (4) formed on said jig (2) and adapted to move laterally said jig (2) along said cathode bar (1) in consequence of the lateral transfer of said engaging claw (6), said jig (2) being composed of a supporting member (10) made of a synthetic resin and inserted around said cathode bar (1) laterally movably along said cathode bar (1), a first planar contact plate (12) made of a conductive metal material including stainless steel and adapted to utilize an upper part side thereof as a contact leaf part (12A) allowed to establish face contact with one lateral face side of said cathode bar (1) and urged with spring pressure exerted by a spring member (11) on the one lateral face side of said cathode bar and utilize a lower part side thereof as a nipping leaf part (12B) adapted to nip said thin-wall ribbonshaped product (A) in the upper part, a second contact plate (14) made of a conductive metal material including stainless steel and having integrally formed in the shape of the letter L a contact leaf part (14A) allowed to establish face contact with a bottom face side of said cathode bar (1) and urged with spring pressure exerted by a spring member (13) on the bottom face side of said cathode bar (1) and a nipping leaf part (14B) opposed to the nipping leaf part (12B) of said first contact plate (12), product nipping spring members (15, 15) adapted to establish close mutual contact between the nipping leaf parts of said first contact plate and said second contact plate and exert spring pressure on said nipping leaf parts from outside so as to allow the closely contacting nipping leaf parts to nip therebetween said thin-wall ribbonshaped product (A) in the upper part thereof, a moving vacant part (16) formed in said supporting member for allowing the lower part of said first contact plate to be moved away from the product nipping position toward the outside, and a pressure imparting means for pressing the cathode bar lateral face contact leaf part of said first contact plate against the one lateral face side of said cathode bar in opposition to the spring pressure of said product nipping spring member (15) urged on said nipping leaf part of said first contact plate, said pressure imparting means being utilized at the position at which said cathode bar forms a narrowed part of the lateral width for pressing said cathode bar lateral face contact leaf part of said first contact plate against a gap formed on the one lateral face side of said cathode bar and pressing an L-shaped corner part (14C) of said second contact plate backward and meanwhile moving the lower part of said first contact plate into the vacant place with a stepped part (16A) formed at an upper end of the vacant place as a fulcrum as to effect mutual separation of said nipping leaf parts and consequent release of said thin-wall ribbon product from the nipping leaf parts.

2. A product conveying mechanism according to claim 1, wherein said pressure imparting means constitutes the spring pressure of said cathode bar lateral face pressing spring member (11).

3. A product conveying mechanism according to claim 1, wherein said pressure imparting means constitutes an operating force for an operating pin moved forward and backward via a through hole (23) formed in said supporting member to reach the cathode bar lateral face contacting leaf part and consequently allow said cathode bar lateral face contacting leaf part of said first contact plate to be pressed against the one lateral face side of said cathode bar.

4. A product conveying mechanism for an electroplating device serving to electroplate thin-wall ribbonshaped products (A) including a printed wiring board given to be plated, which mechanism suspends said products from upper parts thereof nipped with a jig (2) supported laterally movably by a cathode bar (1) and laterally conveys said products (A) in an electrolyte solution (B) held in a tank (3) meanwhile feeding an electric current from said cathode bar (1) to the upper parts of said products through said jig (2), said product conveying mechanism being composed of said jig (2) supported laterally movably by said cathode bar (1) and adapted to suspend said thin-wall ribbonshaped products nipped in the upper parts thereof and feed an electric current to the nipped thin-wall ribbonshaped products, a moving means (5) furnished with an engaging claw (6) to be meshed with an engaging projection (4) formed on said jig and enabled to move laterally said jig along said cathode bar in consequence of the lateral transfer of said engaging claw, and a depressed guide groove (32) formed on a bottom part side in said tank so as to admit lower parts of said laterally conveyed ribbonshaped products as spaced with a fixed interval along a track of conveyance of said ribbonlike products, and said depressed guide groove being furnished with a product sway preventing means (30) constructed by forming said depressed guide groove on a rectifying box (31) formed on a bottom part side in said tank, forming in said depressed guide groove along a central track on a depressed bottom wall of said depressed guide groove a draining conduit (33) for allowing the electrolyte solution in the tank to flow into said rectifying box, forming in said rectifying box a baffle plate (34) containing therein a plurality of open holes (35) for uniformizing the pressure distribution in the electrolyte solution flowing in through said draining conduit, and forming a draining mouth (36) for discharging out of the tank the electrolyte solution which has passed through said rectifying box, thereby guiding the lower parts of said ribbonlike products admitted as spaced with a given interval into said depressed guide groove by dint of a rectifying action of the electrolyte solution discharged uniformly into said rectifying box through said draining conduit formed in said depressed guide groove along the central track on the depressed bottom wall toward the position of said central track on the depressed bottom wall in said depressed guide groove having said draining conduit formed therein.

\* \* \* \* \*